United States Patent [19]

Oelsch

[11] Patent Number: 4,643,497
[45] Date of Patent: Feb. 17, 1987

[54] DEVICE AND METHOD FOR CONNECTING A PRINTED CIRCUIT FILM

[75] Inventor: Jürgen Oelsch, Hohenroth, Fed. Rep. of Germany

[73] Assignee: Preh Elektrofeinmechanische Werke, Jakob Preh, Nachf. GmbH & Co., Bad Neustadt, Fed. Rep. of Germany

[21] Appl. No.: 777,831

[22] Filed: Sep. 19, 1985

[30] Foreign Application Priority Data

Sep. 28, 1984 [DE] Fed. Rep. of Germany ....... 3435836

[51] Int. Cl.<sup>4</sup> .......................... H01R 9/07; H01R 13/66
[52] U.S. Cl. ...................................... 339/17 F; 29/857; 338/211; 338/212; 338/322
[58] Field of Search ...................... 339/17 F, 176 MF; 361/398, 402; 338/211, 212, 220, 322; 29/857

[56] References Cited

U.S. PATENT DOCUMENTS

3,361,936  1/1968  Umantsev ........................... 361/402

FOREIGN PATENT DOCUMENTS

2035646  3/1971  Fed. Rep. of Germany .
2111520  9/1971  Fed. Rep. of Germany .

OTHER PUBLICATIONS

IBM Bulletin, Hafer, vol. 21, No. 11, p. 4634, 4-1979.
Elektronik, No. 16, 1979, pp. 39-45.
Elektronik, No. 14, 1979, pp. 45-55.

*Primary Examiner*—Neil Abrams
*Attorney, Agent, or Firm*—Woodcock Washburn Kurtz Mackiewicz & Norris

[57] ABSTRACT

A flexible carrier film with a printed circuit thereon is provided in combination with a terminal device which provides a plurality of terminal connection pins. A first part of the printed circuit contains a plurality of conductors, and a second part contains a plurality of resistor strips for supplying voltage levels to each conductor. In order to connect the first and second parts without crossings, a grid of connection strips is provided between the conductor strips and resistor strips and connected thereto. The film is bent along a score line extending through the grid and at a right angle thereto, with the conductor strips and resistor strips located on the outside of the folded film. The film is then clamped to the terminal device at the score line so that each connection strip is clamped on both sides of the score line.

11 Claims, 2 Drawing Figures

DEVICE AND METHOD FOR CONNECTING A PRINTED CIRCUIT FILM

BACKGROUND OF THE INVENTION

The present invention pertains to a connecting assembly and method of connection for a printed circuit with a flexible carrier film on which strips are applied as conductors or resistors and, in particular, to such connecting apparatus where the film conductors are connected to a terminal strip connector and are connected through a resistor to a voltage supply.

A keyboard matrix is described in *ELEKTRONIK*, 1979, pp. 39, 40. All column conductors are connected to terminals and a supply voltage is applied to them via resistors. It is thus provided that the column conductors are under the supply voltage when the keys are not actuated. This circuit can be realized in different ways. For example, the resistors through which the voltage is supplied can be arranged on a separate carrier plate and be connected with the terminal strip. This would be expensive, because the circuit of the key matrix or the circuit of the resistors would have to be separately prepared and the two separate parts of the circuit would each have to be connected to the common terminal strip. Further, it would be undesirable to integrate the resistor circuit on the carrier of the key matrix, because crossings would occur.

SUMMARY OF THE INVENTION

The object of the present invention is to provide connection apparatus for a flexible printed circuit film which is easy to prepare, and which enables connecting a resistor circuit part to a conductor circuit part without crossings, while at the same time enabling the conductors of the conductor part to be connected to a terminal output element.

It is another object to provide an improved method of supplying voltages to conductors on a printed circuit film of the type used in keyboards, which method also enables connecting such conductors to output connections pins, the method achieving the desired connections without any crossings on the printed circuit.

The above objects are achieved by a flexible carrier film, or equivalent printed circuit, the film having a first part containing a plurality of conductor strips and a second integral part which contains a plurality of resistor strips for supplying voltages to the conductors. A grid of connection strips, preferably also resistor strips, is positioned between and connected to the conductor strips and the resistor strips, the grid having the same spacing as a grid of connection clamps on a terminal connector. A score line is provided through the connection strips, enabling the film to be folded upon itself and inserted into the terminal connector so that each connection strip is clamped on both sides of the same line. The clamps are in electrical connection with connection pins. A common conductor line leads from the resistor strips to another connection strip on the score line which is also clamped and thus connected to a pin, whereby a supply voltage can be provided. There is thus achieved a simple but efficient manner of providing electrical connection of a plurality of conductors on a film to free ends of connecting pins mounted in a terminal element, as well as providing a supply voltage through the same terminal element.

Both parts of the circuit can be applied on the same side of the film without crossing, in a simple manner. Due to the folding of the film, connection points which are located between the parts of the circuit become accessible for insertion into the terminal element.

In the preferred embodiment of the present invention, a straight score line is located in a zone in which the connection strips extend at an angle of 90° to the score line. The terminal strips preferably extend over both parts of the film, i.e., to each side of the score line. Uncertain contacts due to possible defects in the strips at the bend are thus avoided.

In a preferred embodiment of the present invention, the connector strips comprise resistor strips, and the score line intersects these resistor strips so that the part of each said resistor strip located on one side of the score line has approximately the same length as the part which is located on the other side of the score line. It is thus achieved that the terminal element, or terminal strip, contacts resistor strips rather than conductor strips. This is favorable, because the resistor strips are more resistant to the conditions occurring during the operation.

In an improved variant of the present invention, the connection resistor strips and the resistor strips joining them on one part of the film consist of the same resistor material. Thus, in practicing the method of the invention, it is possible to prepare all resistor strips in a single printing operation. The connection resistor strip and the second resistor strip can form a continuous resistor strip in this case, such that there are no conductors between the resistor strips. To prepare the circuit of this invention, in which a supply voltage is applied to the connecting strips via the second resistor strips, according to the present invention, the poles of the second resistor strip which are remote, or distal, from the connection strip are connected with a common conductor strip which also leads to the terminal strip.

BRIEF DESCRIPTION OF THE DRAWINGS

The preferred embodiments of the present invention are illustrated by the following drawings.

DESCRIPTION OF THE PREFERRED EMBODIMENTS

Figure 1:
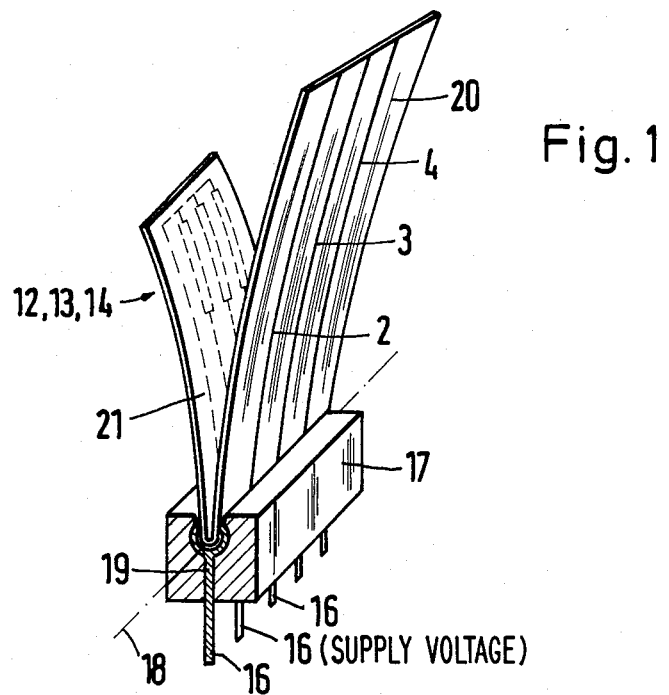
FIG. 1 shows a perspective view of the connection apparatus of this invention.

A flexible carrier film 1 is printed with conductor strips 2 through 8. A first group of connection strips comprising resistor strips 9, 10, and 11 are located between the conductor strips 2 and 5, 3 and 6 and 4 and 7 respectively. A second group of resistor strips 12, 13, and 14 are connected to connection strips 5-7 respectively, and at their opposite ends to common conductor strip 8. The conductor strip 8 is led to a connection strip 15, also preferably a resistor strip. The resistor strips 9 through 15 are printed in a single printing operation using the same resistor paste.

The resistor strips 9, 10, 11, and 15 are parallel to each other and have the same spacing as the connection pins 16 of a terminal strip 17. The conductor strips 2, 3, and 4 lead to connection points (not shown) of a matrix keyboard.

Figure 2:
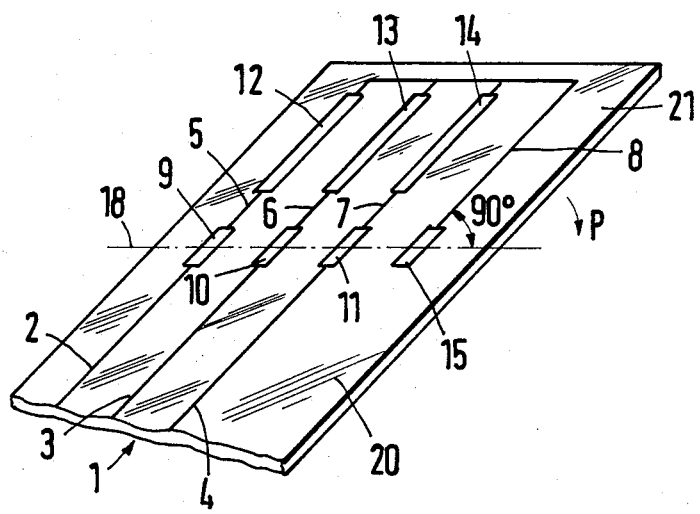
FIG. 2 shows details of the printed film, the film being non-bent.

The carrier film 1 is bent by 180° in the direction of the arrow P (FIG. 2) along a score line 18, as seen also in FIG. 1. The score line 18 extends centrally through the resistor strips 9, 10, 11, and 15 and is preferably at an angle of 90° to the longitudinal extension of the resistor strips.

The connection pins 16 are provided with clamps 19 held in the terminal strip 17, which said clamps hold the strips 9, 10, 11, and 15 on both sides of the score line 18. The clamps 19 bridge over the score line 18, providing mechanical and electrical contact on each side. The free ends of pins 16 are available for connection as desired.

As illustrated, two film parts 20 and 21 are formed by bending the film 1. The circuits of these film parts can be electrically connected to the resistor strips 9, 10, 11, and 15 via the connection pins 16. As is apparent, this does not require any crossing of the conductor strips or resistor strips.

Simple contacting by insertion of the bent film into the terminal strip 17 is possible due to the fact that the conductor strips 2 through 8 and the resistor strips 9 through 15 on the film parts 20 and 21 are located on the outside, i.e., on the sides of the film parts 20 and 21 turned away from each other. It is thus seen that a simple but efficient means and method is provided for connecting the conductors to the terminal strip, and for connecting voltage through resistors to each of the conductors. It is to be understood that the invention as illustrated shows the preferred geometry of the conductors, strip resistors, and score line, but that variations may be utilized within the scope of the invention.

I claim:

1. Connection apparatus for providing a plurality of electrical connections to conductors on a printed circuit film, comprising:
    a terminal strip device having a plurality of connection pins, each said pin having a free end and an opposite end having a clamp for receiving a film, said clamps being located with a predetermined grid spacing,
    a flexible carrier film having thereon a grid of connection strips located with said grid spacing, a plurality of conductors on a first part of said film of a first side of said grid, each connected to a respective connection strip, and a plurality of resistors on a second part of said film on the opposite side of said grid and each connected to a respective connection strip, further characterized by said film having a score line substantially at a right angle to and through said grid, the parts of said film being folded toward each other at said score line with said conductors and resistors being located on the outside of said folded film, said folded film being inserted into said terminal strip device at said score line so that each said connection strip is received into a respective one of said clamps.

2. The apparatus in accordance with claim 1, characterized in that said score line is substantially straight, and said connection strips extend at an angle of about 90° from said score line.

3. The apparatus in accordance with claims 1 or 2, characterized in that said terminal strip device bridges over both of said film parts.

4. The apparatus in accordance with claim 1 or 2, characterized in that said score line substantially bisects said connection strips.

5. The apparatus in accordance with claim 1 or 2, characterized in that said connection strips are resistor strips and are comprised of the same resistor material as said resistors, and each said connection strip joins a respective resistor at substantially a right angle to said score line on said second part.

6. The apparatus in accordance with claim 1, characterized in that said connection strips and said resistors comprise continuous resistor strips and are comprised of the same resistor material.

7. The apparatus in accordance with claim 1, comprising a common conductor strip on said second part, said common strip being connected to each of said plurality of resistors.

8. The apparatus in accordance with claim 7, wherein another connection strip is located on said score line, and said common strip is connected to said another connection strip.

9. The apparatus in accordance with claim 7, comprising a resistor strip located on said score line next to said grid of connection strips and wherein said common conductor strip terminates at said resistor strip.

10. The apparatus in accordance with claim 7, characterized in that another resistor strip is connected to said common conductor strip.

11. A method of connecting a plurality of conductors on a printed circuit film to a terminal strip having a plurality of terminal pins, comprising:
    arranging said plurality of conductors on a first part of said film,
    arranging a first plurality of resistor strips on a second part of said film,
    arranging a plurality of connection strips constituting resistor strips between said conductors an said first plurality of resistor strips, and connecting each said connection strip between a respective conductor and a respective resistor strip of said first plurality,
    arranging another connection strip near said plurality of connection strips to form a grid, said connection strips having a grid spacing corresponding to the terminal pins of said terminal strip, and connecting said first plurality of resistor strips in common to said another connection strip,
    providing a score line through said connection strip grid and bending said film upon itself at said score line so that said conductors and resistor strips are to the outside of said bent film, and
    inserting said bent film into said terminal strip at said score line so that said grid of connection strips are connected to said plurality of terminal pins.

* * * * *